United States Patent
Shi et al.

(10) Patent No.: US 9,978,609 B2
(45) Date of Patent: May 22, 2018

(54) LOW DISHING COPPER CHEMICAL MECHANICAL PLANARIZATION

(71) Applicant: Air Products and Chemicals, Inc., Allentown, PA (US)

(72) Inventors: Xiaobo Shi, Chandler, AZ (US); James Allen Schlueter, Phoenix, AZ (US); Joseph Rose, Chandler, AZ (US); Mark Leonard O'Neill, Queen Creek, AZ (US); Malcolm Grief, Phoenix, AZ (US)

(73) Assignee: VERSUM MATERIALS US, LLC, Tempe, AZ (US)

( * ) Notice: Subject to any disclaimer, the term of this patent is extended or adjusted under 35 U.S.C. 154(b) by 0 days. days.

(21) Appl. No.: 15/001,846

(22) Filed: Jan. 20, 2016

(65) Prior Publication Data

US 2016/0314989 A1    Oct. 27, 2016

Related U.S. Application Data (60) Provisional application No. 62/153,213, filed on Apr. 27, 2015.

(51) Int. Cl.
| | |
|---|---|
| *H01L 21/321* | (2006.01) |
| *C09G 1/02* | (2006.01) |
| *B24B 37/04* | (2012.01) |
| *C09K 3/14* | (2006.01) |

(52) U.S. Cl.
CPC ........ *H01L 21/3212* (2013.01); *B24B 37/044* (2013.01); *C09G 1/02* (2013.01); *C09K 3/1463* (2013.01)

(58) Field of Classification Search
CPC ....... H01L 21/3212; B24B 37/44; C09G 1/02; C09K 3/1463
See application file for complete search history.

(56) References Cited

U.S. PATENT DOCUMENTS

| | | |
|---|---|---|
| 5,230,833 A | 7/1993 | Romberger et al. |
| 6,773,476 B2 | 8/2004 | Sakai et al. |
| 8,236,695 B2 | 8/2012 | Liu et al. |
| 2002/0025762 A1 | 2/2002 | Luo et al. |
| 2004/0084414 A1 | 5/2004 | Sakai et al. |
| 2004/0175942 A1 | 9/2004 | Chang et al. |
| 2011/0100956 A1 | 5/2011 | Keleher et al. |
| 2016/0221146 A1* | 8/2016 | Lugg ................. B24D 3/10 |

FOREIGN PATENT DOCUMENTS

| | | |
|---|---|---|
| EP | 2 123 726 A1 | 11/2009 |
| JP | 200582791 A2 | 3/2005 |
| JP | 2007326916 A2 | 12/2007 |
| JP | 2009147278 A2 | 7/2009 |
| JP | 2009302551 A2 | 12/2009 |
| WO | 2004033574 A1 | 4/2004 |
| WO | 2009098951 A1 | 8/2009 |

OTHER PUBLICATIONS

WO2015004567, description.*

* cited by examiner

*Primary Examiner* — Duy Vu N Deo
(74) *Attorney, Agent, or Firm* — Lina Yang (57) ABSTRACT

Copper chemical mechanical polishing (CMP) formulation, method and system are disclosed. The CMP formulation comprises particulate materials, at least two or more amino acids, oxidizer, corrosion inhibitor, and rest being water.

12 Claims, 2 Drawing Sheets

LOW DISHING COPPER CHEMICAL MECHANICAL PLANARIZATION

CROSS-REFERENCE TO RELATED APPLICATIONS

This application claims benefit of a U.S. Provisional Application No. 62/153,213, filed Apr. 27, 2015. The disclosures of the provisional application are hereby incorporated by reference.

BACKGROUND OF THE INVENTION

This invention relates generally to the chemical-mechanical planarization (CMP) of semiconductor wafers. More specifically, present invention relates to low dishing formulations used for CMP copper (Cu)-containing substrates. CMP polishing formulations, CMP polishing compositions or CMP polishing slurries are interchangeable in present invention.

Copper is the current material of choice for interconnect metal used in the fabrication of integrated electronic devices due to its low resistivity, high reliability, and scalability. Copper chemical mechanical planarization processes are necessary to remove copper overburden from inlaid trench structures while achieving global planarization with low metal loss.

With advancing technology nodes the need to reduce metal dishing and metal loss becomes increasingly important. Any new polishing formulations must also maintain high removal rates, high selectivity to the barrier material and low defectivity.

CMP formulations for copper CMP have been disclosed in the prior arts, for example, in. US20040175942, U.S. Pat. Nos. 6,773,476, and 8,236,695. However the disclosed formulations were unable to meet the performance requirements of high removal rates and low dishing which become more and more challenging for advanced technology nodes.

This invention discloses bulk copper CMP polishing formulations developed to meet challenging requirements of low dishing and high removal rates for the advanced technology nodes.

BRIEF SUMMARY OF THE INVENTION

In one aspect, the present invention provides a copper chemical mechanical polishing (CMP) formulation comprising:
 particulate materials,
 at least two amino acids,
 oxidizer,
 corrosion inhibitor,
 and
 rest being water.

In another aspect, the present invention provides a method of chemical mechanical polishing a copper containing semiconductor substrate, comprising steps of:
 providing the semiconductor substrate having a surface containing copper;
 providing a polishing pad;
 providing a chemical mechanical polishing (CMP) formulation comprising
  particulate materials,
  at least two amino acids,
  oxidizer,
  corrosion inhibitor,
  and
  rest being water;
 contacting the surface of the semiconductor substrate with the polishing pad and the chemical mechanical polishing formulation; and
 polishing the surface of the semiconductor;
 wherein at least a portion of the surface containing copper is in contact with both the polishing pad and the chemical mechanical polishing formulation.

In yet another aspect, the invention provides a system of chemical mechanical polishing, comprising
 a semiconductor substrate having a surface containing copper;
 providing a polishing pad;
 providing a chemical mechanical polishing (CMP) formulation comprising
  particulate materials,
  at least two amino acids,
  oxidizer,
  corrosion inhibitor,
  and
  rest being water;
 wherein at least a portion of the surface containing copper is in contact with both the polishing pad and the chemical mechanical polishing formulation.

The particulate materials include, but are not limited to fumed silica, colloidal silica, fumed alumina, colloidal alumina, cerium oxide, titanium dioxide, zirconium oxide, polystyrene, polymethyl methacrylate, mica, hydrated aluminum silicate, and mixtures thereof. The particulate material concentration may range from 0.001 to 0.25 wt %.

A variety of amino acids including derivatives are organic compounds containing amine and carboxylic acid functional groups. Additional functional groups may also be present in the amino acid structures. The amino acids can be used in the composition including but are not limited to aminoacetic acid (also known as glycine), serine, lysine, glutamine, L-alanine, DL-alanine, Beta-alanine, iminoacetic acid, asparagine, aspartic acid, valine, sarcosine, bicine, tricin, proline, and mixtures thereof. A preferred combinations of amino acids include glycine (aminoacetic acid), alanine, bicine, and sarcosine. The concentration of the amino acids is within the range of about 0.01% to about 8% by weight; preferably 0.05% to about 5% by weight, and more preferably about 0.25% and about 2% by weight. The weight concentration ratio of one amino acid to another amino acid used in the slurry ranges from 1:99 to 99:1; preferably from 10:90 to 90:10, more preferably from 25:75 to 75:25.

The corrosion inhibitors include but are not limited to nitrogenous cyclic compounds such as 1,2,3-triazole, 1,2,4 triazole, 1,2,3-benzotriazole, 5-methylbenzotriazole, benzotriazole, 1-hydroxybenzotriazole, 4-hydroxybenzotriazole, 4-amino-4H-1,2,4-triazole, and benzimidazole. Benzothiazoles such as 2,1,3-benzothiadiazole, triazinethiol, triazinedithiol, and triazinetrithiol can also be used.

Preferred inhibitors are 1,2,4-triazole, 5 amino triazole and isocyanurate compounds such as 1,3,5-tris(2-hydroxyethyl)isocyanurate. The corrosion inhibitor is incorporated at a concentration level in the range of about 0.1 ppm to about 20,000 ppm by weight, preferably about 20 ppm to about 10,000 ppm by weight, and more preferably about 50 ppm to about 1000 ppm by weight.

The oxidizing agent includes but is not limited to hydrogen peroxide, ammonium dichromate, ammonium perchlorate, ammonium persulfate, benzoyl peroxide, bromates, calcium hypochlorite, ceric sulfate, chlorates, chromium trioxide, ferric trioxide, ferric chloride, iodates, iodine, magnesium perchlorate, magnesium dioxide, nitrates, periodic acid, permanganic acid, potassium dichromate, potassium ferricyanide, potassium permanganate, potassium persulfate, sodium bismuthate, sodium chlorite, sodium dichromate, sodium nitrite, sodium perborate, sulfates, peracetic acid, urea-hydrogen peroxide, perchloric acid, di-t-butyl peroxide, monopersulfates and dipersulfates, and combinations thereof. The oxidizing agent has a concentration in the range of about 0.1% to about 20% by weight, preferably about 0.25% to about 5% by weight.

The CMP formulation further comprises surfactants, include, but are not limited to phenyl ethoxylate surfactant, acetylenic diol surfactant, sulfate or sulfonate surfactant, glyceroal propoxylate, glyceroal ethoxylate, polysorbate surfactant, non-ionic alkyl ethoxylate surfactant, glycerol propoxylate-block-ethoxylate, amine oxide surfactant, glycolic acid ethoxylate oleyl ether, polyethylene glycol, polyethylene oxide, ethoxylated alcohols, ethoxylate-propoxylate surfactant, polyether defoaming dispersion, and other surfactants. Surfactant concentration can be in the range of 0.001-0.5 wt %, preferably between 0.01 to 0.25 wt %.

The CMP formulation further comprises at least one selected from the group consisting of pH adjusting agent, biocideor or biological preservative, dispersing agent, and wetting agent.

BRIEF DESCRIPTION OF SEVERAL VIEWS OF THE DRAWINGS

In the accompanying drawing forming a material part of this description, there is shown.

DETAILED DESCRIPTION OF THE INVENTION

Bulk copper CMP polishing compositions developed for the advanced technology node is disclosed in present invention. The formulations have shown improved dishing performance, lower copper etch rates.

Formulations comprise particulate materials, two or more amino acids, oxidizer, a copper corrosion inhibitor, and the rest of the formulation being liquid carrier.

Generally, a wide range of particulate materials or particles, can be used. The particles can be obtained through a variety of manufacturing and processing techniques, including but not limited to thermal processes, solution growth processes, mining of raw ore and grinding to size, and rapid thermal decomposition. The materials can be incorporated into the composition generally as supplied by the manufacturer. Certain types of the particulate materials used in the composition at higher concentrations as abrasive materials. However, other particulate materials which have not traditionally been used as abrasives in CMP slurries can also be used to provide advantageous results.

Representative particulate materials include a variety of inorganic and organic materials which are inert under the use conditions of the slurries of the invention. The particulate materials include, but are not limited to fumed silica, colloidal silica, fumed alumina, colloidal alumina, cerium oxide, titanium dioxide, zirconium oxide, polystyrene, polymethyl methacrylate, mica, hydrated aluminum silicate, and mixtures thereof. The particulate materials have particle sizes ranging from about 4 nm to about 10,000 nm, preferably from about 4 nm to about 1,000 nm, and more preferably from about 4 nm to about 400 nm. The particles may exist in a variety of physical forms, such as but not limited to platelet, fractal aggregate and spherical species.

The preferred particulate material is colloidal silica. Still preferred is colloidal silica with very low levels of trace metal impurities. Examples of high purity colloidal silica that can be used are Fuso PL-3, PL2, PL3H and PL3L high purity colloidal silica particles obtained from Fuso Chemical Company, Japan.

A mixture of colloidal silica particles of different particle sizes and types may also yield improved performance The particulate material concentration may range from 0.001 to 0.25 wt %.

The formulations comprise at least two amino acids or at least two chelators (the amino acids are chelators).

A variety of amino acids and derivatives, referred as amino acids in the present invention, can be used in the preparation of the CMP formulation. Amino are defined as organic compounds containing amine and carboxylic acid functional groups. Additional functional groups may also be present in the amino acid structures. The amino acids can be used in the composition including but are not limited to aminoacetic acid (also known as glycine), serine, lysine, glutamine, L-alanine, DL-alanine, Beta-alanine, iminoacetic acid, asparagine, aspartic acid, valine, sarcosine, bicine, tricin, proline, and mixtures thereof. A preferred combinations of amino acids include glycine (aminoacetic acid), alanine, bicine, and sarcosine.

The presence of amino acid in the formulation has been found to affect the rate of copper removal during the CMP process. However, increased amino acid levels increase the etching rate of the copper, which is undesirable. Concentration levels are therefore adjusted to achieve an acceptable balance between copper rate of removal and the etching rate.

Typically, the concentration of the amino acids is within the range of about 0.01% to about 16% by weight; preferably 0.05% to about 5% by weight, and more preferably about 0.25% and about 2% by weight.

The weight concentration ratio of one amino acid to another amino acid used in the slurry ranges from 1:99 to 99:1; preferably from 10:90 to 90:10; more preferably from 25:75 to 75:25.

The formulation can comprise a corrosion inhibitor to limit metal corrosion and etching during the CMP process. The corrosion inhibitor forms a protective film on the metal surface by either physical adsorption or chemical adsorption. Thus, the corrosion inhibitor operates to protect the copper surface from the effects of etching and corrosion during the CMP process.

The corrosion inhibitors include but are not limited to nitrogenous cyclic compounds such as 1,2,3-triazole, 1,2,4 triazole, 1,2,3-benzotriazole, 5-methylbenzotriazole, benzotriazole, 1-hydroxybenzotriazole, 4-hydroxybenzotriazole, 4-amino-4H-1,2,4-triazole, 5-amino triazole, and benzimidazole. Benzothiazoles such as 2,1,3-benzothiadiazole, triazinethiol, triazinedithiol, and triazinetrithiol can also be used. Preferred inhibitors are 1,2,4-triazole and 5-amino triazole.

Isocyanurate compounds such as 1,3,5-tris(2-hydroxyethyl)isocyanurate are also found to be useful for corrosion inhibition and improvement in the performance.

The corrosion inhibitor is incorporated at a concentration level in the range of about 0.1 ppm to about 20,000 ppm by weight, preferably about 20 ppm to about 10,000 ppm by weight, and more preferably about 50 ppm to about 1000 ppm by weight.

The oxidizing agent performs an oxidizing function and facilitates conversion of copper on the wafer surface to hydrated copper compounds of either CuOH, Cu(OH)2, CuO, or Cu2O.

The oxidizing agent includes but is not limited to hydrogen peroxide, ammonium dichromate, ammonium perchlorate, ammonium persulfate, benzoyl peroxide, bromates, calcium hypochlorite, ceric sulfate, chlorates, chromium trioxide, ferric trioxide, ferric chloride, iodates, iodine, magnesium perchlorate, magnesium dioxide, nitrates, periodic acid, permanganic acid, potassium dichromate, potassium ferricyanide, potassium permanganate, potassium persulfate, sodium bismuthate, sodium chlorite, sodium dichromate, sodium nitrite, sodium perborate, sulfates, peracetic acid, urea-hydrogen peroxide, perchloric acid, di-t-butyl peroxide, monopersulfates and dipersulfates, and combinations thereof.

Preferably the oxidizing agent is incorporated into the formulation on site at the time of use or shortly prior thereto. It is also possible to incorporate the oxidizing agent at the time of combining the other components, though stability of the thus-formed composition over longer storage conditions must be taken into consideration.

The oxidizing agent has a concentration in the range of about 0.1% to about 20% by weight, preferably about 0.25% to about 5% by weight.

Surfactants when added to these formulations are also found to have useful impact in reducing dishing and defects. Surfactants can be non-ionic, cationic, anionic or zwitterionic.

The examples of surfactants include, but are not limited to phenyl ethoxylate type surfactant such as Nonidet®P40 (octylphenoxypolyethoxyethanol) and acetylenic diol surfactant such as Dynol®607, Dynol®800, Dynol®810, Dynol®960, Dynol®980, Surfynol 104E, Surfynol 465, Surfynol 485, Surfynol PSA 336, Surfynol FS85, Surfynol SE, Surfynol SE-F; anionic surfactants such as sulfate or sulfonate surfactants; glyceroal propoxylates; glyceroal ethoxylates; polysorbate surfactants such as Tween 20, Tween 40, Tween 60, Tween 80, non-ionic alkyl ethoxylate type surfactants such as Brij LA-4; glycerol propoxylate-block-ethoxylates; amine oxide surfactants such as Tomamine AO-455 and Tomamamine AO-405; glycolic acid ethoxylate oleyl ether surfactants; polyethylene glycols; polyethylene oxide;

ethoxylated alcohols such as Tomadol 23-6.5, Tomadol 91-8, carbowet 13-40; ethoxylate-propoxylate surfactants such as Tergitol Minfoam 1X, Tergitol Minfoam 2X; Polyether defoaming dispersions such as DF204, and other surfactants. The preferred surfactants for effectively reducing Cu line dishing are include phenyl ethoxylate (e.g. Nonidet P40), acetylenic diol surfactant (e.g. Surfynol 104E, Dynol®607, Dyno®800, Dynol®810), ethoxylate-propoxylate surfactants such as Tergitol Minfoam 1X, polyether dispersions (e.g. DF204). Surfactant concentration can be in the range of 0.001-0.5%, more preferably between 0.01 to 0.25%.

The preferred surfactants for effectively reducing Cu line dishing are include phenyl ethoxylate (e.g. Nonidet P40), acetylenic diol surfactant (e.g. Surfynol 104E, Dynol®607, Dyno®800, Dynol®810), ethoxylate-propoxylate surfactants such as Tergitol Minfoam 1X, polyether dispersions (e.g. DF204). Surfactant concentration can be in the range of 0.001-0.5%, more preferably between 0.01 to 0.25%.

The formulations may also comprise other optional additives such as biocides or biological preservative, dispersing agents, wetting agents, pH adjusting agent etc.

The CMP composition may comprise biocides, i.e., biological growth inhibitors or preservatives to prevent bacterial and fungal growth during storage. The biological growth inhibitors include, but are not limited to, tetramethylammonium chloride, tetraethylammonium chloride, tetrapropylammonium chloride, alkylbenzyldimethylammonium chloride, and alkylbenzyldimethylammonium hydroxide, wherein the alkyl chain ranges from 1 to about 20 carbon atoms, sodium chlorite, and sodium hypochlorite. Some of the commercially available preservatives include KATHON™ (such as Kathon II) and NEOLENE™ product families from Dow Chemicals, and Preventol™ family from Lanxess. More are disclosed in U.S. Pat. No. 5,230,833 (Romberger et al.) and US Patent Application No. US 20020025762. The contents of which are hereby incorporated by reference as if set forth in their entireties.

The pH-adjusting agent includes, but is not limited to, sodium hydroxide, cesium hydroxide, potassium hydroxide, cesium hydroxide, ammonium hydroxide, quaternary organic ammonium hydroxide (e.g. tetramethylammonium hydroxide) and mixtures thereof.

Dispersing agents can be used to improve colloidal stability of particles. Dispersing agents may comprise surfactants and polymers. Examples of dispersing agents include poly-acrylic acid, poly-meth acrylic acid.

The rest of the formulation is water which provides the principle portion of the liquid component. Advantageously the water is deionized (DI) water.

pH of the formulations may range from 2-12, more preferably between 4 and 9 and most preferable between 6 and 8.

The formulations can be made in concentrated forms and diluted with DI water at the time of polishing in order to reduce costs associated with shipping and handling. The dilutions can range from 1 part slurry concentrate: 0 parts water to 1 part slurry concentrate: 1000 parts water, or between 1 part slurry concentrate: 3 parts water to 1 part slurry concentrate: 100 parts water, or between 1 part slurry concentrate: 5 parts water to 1 part slurry concentrate: 50 parts water.

Formulations of this invention are used to polish patterned wafer with copper interconnect lines to provide high removal rate of copper and yet low dishing.

Copper CMP is generally carried out in three steps. In the first step, bulk copper is removed with polishing conditions with high removal rates from the patterned wafer and a planarized surface is formed. In the second step, a more controlled polishing is performed to remove remaining copper to reduce dishing and then stopping at the barrier layer. The third step involves removal of barrier layer. Formulations of this invention can be used in steps 1 and 2 as described above. In the step 1, higher downforce or table speed can be used to polish copper at high removal rates and a lower downforce or lower table speed for step 2 of the copper CMP. Typically the first step polish is carried out at down-force of 2.5 psi or higher. The second step polish is carried out down-force of 1.5 psi or lower. It is desired that the copper removal rates be high to obtain acceptable throughput for a wafer production. Preferably the desired CMP removal rate for the second step CMP is at least 3000 Å/min or more preferably or more preferably more than 4000 Å/min. For the first step, the desired removal rate is more than 6000 Å/min.

Formulations of this invention are able to polish copper at high selectivity to the barrier or polish stop layer. Preferred removal rate selectivity between copper and the barrier layer is more than 50. These formulation may be used in variety of integration schemes using copper or copper based alloys as interconnect material with a range of possible barrier/polish stop layers including but not limited to Ta, TaN, Ti, TiN, Co, Ru.

Formulations of this inventions comprising two or more amino acids allow slurries to be formulated such that the removal rates are comparable with those obtained with formulations comprising only one amino acids and yet provide significant reduction in dishing performance. In preferred embodiments removal rates of slurry formulations comprising two or more amino acids provides a dishing r on 100×100 μm line structures less than 75% dishing and a removal rate which is at least 70% compared with a slurry formulation comprising a single amino acid. In more preferred embodiments removal rates of slurry formulations comprising two or more amino acids provides a dishing r on 100×100 μm line structures less than 60% dishing and a removal rate which is at least 75% compared with a slurry formulation comprising a single amino acid.

The present invention is further demonstrated by the examples below.

GENERAL EXPERIMENTAL PROCEDURE

The associated methods described herein entail use of the aforementioned slurry for chemical mechanical planarization of substrates comprised of copper.

In the methods, a substrate (e.g., a wafer with copper surface) is placed face-down on a polishing pad which is fixedly attached to a rotatable platen of a CMP polisher. In this manner, the substrate to be polished and planarized is placed in direct contact with the polishing pad. A wafer carrier system or polishing head is used to hold the substrate in place and to apply a downward pressure against the backside of the substrate during CMP processing while the platen and the substrate are rotated. The polishing formulation is applied (usually continuously) on the pad during CMP processing to effect the removal of material to planarize the substrate.

The polishing slurry and associated methods described herein are effective for CMP of a wide variety of substrates, including most of substrates having, particularly useful for polishing copper substrates.

In the examples presented below, CMP experiments were run using the procedures and experimental conditions given below.

The CMP tool that was used in the examples is a Mirra®, manufactured by Applied Materials, 3050 Boweres Avenue, Santa Clara, Calif., 95054.

Polishing was carried out with table-speed of 93 RPM with 200 mL/min slurry flow rare on IC1010® pad from Dow Chemicals. For removal rate data, electroplated copper wafers were used for polishing. Dishing data was obtained on MIT854 patterned wafers with Cu lines in TEOS dielectric with Ta/TaN barrier layer. Patterned wafer polishing involved polishing at 2.5 psi downforce for 1 minute for the first step of polish, followed by polishing at 1.5 psi till the defined end-point for polishing. Defined end-point was 20 seconds after the copper is cleared from the patterned wafer surface as detected by optical end-point technique on Mirra®. Dishing measurement were performed using profilometric technique.

WORKING EXAMPLE

Example 1

CMP formulations all comprising 215 ppm 1,2,4-Triazole as corrosion inhibitor, 63 ppm colloidal silica (Mean Particle Size-MPS was about 48nm supplied by Fuso); 550 ppm Dynol 607, 1 wt % hydrogen peroxide, but different combinations of amino acids, with remainder being water were described in table 1.

TABLE 1

| Formulation # | Amino Acid (I) | Amino Acid (I) Concentration (wt %) | Amino Acid (II) | Amino Acid (II) Concentration (wt %) |
|---|---|---|---|---|
| 1 | Glycine | 0.6 | None | 0 |
| 2 | Glycine | 0.6 | DL-Alanine | 0.8 |
| 3 | Glycine | 0.6 | Serine | 0.8 |
| 4 | Glycine | 0.6 | Bicine | 0.2 |
| 5 | Glycine | 0.6 | Proline | 0.8 |
| 6 | Glycine | 0.6 | Beta-Alanine | 0.8 |
| 7 | Glycine | 0.6 | Sarcosine | 0.2 |
| 8 | Glycine | 0.6 | Tricine | 0.2 |

TABLE 2

| Formulation # | Cu Removal rate @2.5 psi (Å/min) | Cu Removal rate @1.5 psi (Å/min) | Removal Rate @ 1.5 relative to Formulation 1 | Dishing (Å) for 100 × 100 μm line | Dishing relative to dishing for formulation 1 |
|---|---|---|---|---|---|
| 1 | 8636 | 6499 | 100% | 1624 | 100.0 |
| 2 | 10905 | 6400 | 98.5% | 1047 | 64.5 |
| 3 | 11240 | 7329 | 112.8% | 1075 | 66.2 |
| 4 | 8044 | 5060 | 77.9% | 465 | 28.6 |
| 5 | 8609 | 5384 | 82.8% | 733 | 45.1 |
| 6 | 7024 | 4702 | 72.3% | 797 | 49.1 |
| 7 | 6740 | 4312 | 66.3% | 437 | 26.9 |
| 8 | 8155 | 5474 | 84.2% | 813 | 50.1 |

Cu removal rates at 1.5 psi and 2.5 psi downforces and the dishing data on 100×100 μm line structures from the formulations were both shown in Table 2. Dishing data was obtained while polishing the patterned wafer at 1.5 downforce while stopping at the barrier layer.

It's evident from the data results that formulations with combined amino acids resulted in reduction in dishing without compromising removal rates. It was even possible to increase the removal rates while reducing dishing with a combination of amino acids, as shown in formulation 3.

Among these dual chelator combinations, glycine/bicine or glycine/sarcosione afforded relative low wide copper line dishing on 100×100 μm line at 465 Å and 437 Å respectively.

Example 2

Formulations 9 -14 all comprising glycine, 215 ppm of 1,2,4-triazole as corrosion inhibitor, 1.9 ppm Kathon II as biocide, and 62.5 ppm colloidal silica (MPS was about 48 nm supplied by Fuso) as abrasive, 1.0 wt % H2O2 as oxidizing agent, with remainder being water were described in table 3. All formulations were made with various additives. Formulations 12-16 all comprised bicine.

TABLE 3

| Formulation # | Glycine Concentration (wt %) | Bicine Concentration (wt %) | Additive | Additive Concentration (wt %) |
|---|---|---|---|---|
| 9 | 0.635 | 0 | Dynol 607 | 0.055 |
| 10 | 0.6 | 0.2 | Surfynol 104E | 0.1 |
| 11 | 0.6 | 0.2 | Dynol 607 | 0.055 |
| 12 | 0.6 | 0.2 | DF204 | 0.1 |
| 13 | 0.6 | 0.2 | Tergitol Minfoam 1X | 0.1 |
| 14 | 0.6 | 0.2 | Noidet P40 | 0.1 |

The formulations were made with various amounts of glycine and bicine to provide removal rates similar to those obtained with formulations comprising glycine only.

Table 4 summarized the Cu removal rates and dishing for 100×100 µm lines for the formulations listed in Table 3. The data were listed as relative to the formulation without using bicine.

As shown in Table 4, it's clear that using a combination of glycine and bicine with concentrations so chosen to provide comparable removal rates, a dramatic reduction in dishing was obtained. Best dishing performance was obtained with Non-idet P40 additive and a combination of glycine and bicine.

TABLE 4

| Formulation # | Cu Removal rate @1.5 psi (Å/min) | Removal Rate @ 1.5 relative to Formulation 9 | Dishing (Å) for 100 × 100 µm line | Dishing relative to dishing for formulation 9 |
|---|---|---|---|---|
| 9 | 4833 | 100.0 | 2353 | 100.0 |
| 10 | 5570 | 115.2 | 654 | 27.8 |
| 11 | 4810 | 99.5 | 513 | 21.8 |
| 12 | 4465 | 92.4 | 465 | 19.8 |
| 13 | 4548 | 94.1 | 353 | 15.0 |
| 14 | 5120 | 105.9 | 151 | 6.4 |

Example 3

Formulations were prepared to compare formulations comprising one amino acid with the combination of two amino acids.

Formulations 15-17 also comprised 215 ppm 1,2,4-triazole as corrosion inhibitor, 1.9 ppm Kathon II as biocide, 0.1% Nonidet P40 as dishing reducer and 62.5 ppm colloidal silica (MPS is about 48 nm supplied by Fuso) as abrasive, 1.0 wt % $H_2O_2$ as oxidizing agent, with remainder being water, as described in table 5.

TABLE 5

| Formulation # | Glycine Concentration (wt %) | DL-Alanine Concentration (wt %) |
|---|---|---|
| 15 | 0.8 | 0 |
| 16 | 0 | 1.8 |
| 17 | 0.375 | 0.535 |

Cu removal rates and dishing for 100×100 µm lines with the formulations were shown in Table 6.

TABLE 6

| Formulation # | Cu Removal rate @2.5 psi (Å/min) | Cu Removal rate @1.5 psi (Å/min) | Removal Rate @ 1.5 relative to Formulation 15 | Dishing (Å) for 100 × 100 µm line | Dishing relative to dishing for formulation 15 |
|---|---|---|---|---|---|
| 15 | 8952 | 6250 | 100.0 | 1034 | 100.0 |
| 16 | 8150 | 4130 | 66.1 | 1243 | 120.2 |
| 17 | 8120 | 5439 | 87.0 | 778 | 75.2 |

Formulation comprising both glycine and alanine (formulation 17) demonstrated significantly reduced dishing compared to formulations comprising glycine or alanine alone without significant compromise in Cu removal rates.

Example 4

Formulations 18 (one amino acid, glycine only) and 19 (two amino acids, glycine and bicine) were made to provide high copper removal rates at 1.5 psi downforce. Formulations also comprised water, 0215 wt % 1,2,4-triazole,1.9 ppm Kathon II, 0.025 wt % high purity colloidal silica (MPS was about 48nm supplied by Fuso), and 1.0 wt % $H_2O_2$. Both formulations had a pH around 7.25.

The formulations were shown in Table 7.

TABLE 7

| Formulation # | Glycine Concentration (wt %) | Bicine concentration (wt %) |
|---|---|---|
| 18 | 0.8 | 0 |
| 19 | 0.6 | 0.2 |

Cu removal rates and dishing for 100×100 µm lines with the formulations were shown in Table 8.

TABLE 8

| Formulation # | Cu Removal rate @1.5 psi (Å/min) | Removal Rate @ 1.5 relative to Formulation 18 | Dishing (Å) for 100 × 100 µm line | Dishing relative to dishing for formulation 18 |
|---|---|---|---|---|
| 18 | 6841 | 100.0% | 2022 | 100.0% |
| 19 | 6041 | 88.3% | 1046 | 51.73% |

As shown in table 8, combination of glycine and bicine (formulation 19) afforded significantly reduced Cu line dishing on 100×100 µM line features than the glycine only based formulation

Example 5

Formulations 20 (one amino acid, glycine only) and 21 (two amino acids, glycine and DL-alanine) were made to provide high copper removal rates at 1.5 psi downforce. Formulations also comprised water, 0215 wt % 1,2,4-triazole,1.9 ppm Kathon II, 0.025 wt % High Purity Colloidal Silica(MPS was about 48nm supplied by Fuso), and 1.0 wt % $H_2O_2$. Both formulations had a pH around 7.25.

The formulations were shown in Table 9.

TABLE 9

| Formulation # | Glycine Concentration (wt %) | DL-alanine concentration (wt %) |
|---|---|---|
| 20 | 0.8 | 0 |
| 21 | 0.6 | 0.8 |

Cu removal rates and dishing for 100×100 μm lines with the formulations were shown in Table 10.

TABLE 10

| Formulation # | Cu Removal rate @1.5 psi (Å/min) | Removal Rate @ 1.5 relative to Formulation 20 | Dishing (Å) for 100 × 100 μm line | Dishing relative to dishing for formulation 20 |
|---|---|---|---|---|
| 20 | 6841 | 100% | 2022 | 100.0% |
| 21 | 6812 | 88.3% | 1550 | 76.65% |

As shown again in table 10, combination of two amino acids, i.e. glycine and alanine (formulation 21) afforded significantly reduced Cu line dishing on 100×100 μM line features than the glycine only based formulation.

Example 6

Specific formulations I and II have shown in Table 11.

Formulation I had dual chelators i.e. two amino acids. Formulation II had only one amino acid. The pH for Formulations was around 6.15-6.25.

The CMP performance with Formulation I comprising two amino acids was compared with Formulation II comprising only one amino acid. The results were shown in FIGS. 1 and 2.

TABLE 11

| | Formulation I (wt %) | Formulation II (wt %) |
|---|---|---|
| Glycine | 0.55 | 0.64241 |
| DL-Alanine | 0.80 | |
| 1,2,4-Triazole | 0.0215 | 0.0315 |
| Kathon II | 0.0001915 | 0.000174 |
| Dynol 607 | 0.055 | |
| Fuso PL2 (High Purity Silica) | 0.014 | |
| 1,3,5-Tris(2-hydroxyethyl)isocyanurate | 0.00025 | |
| Poliedge 2002 (Silica) | | 0.006264 |
| $H_2O_2$ | 1 | 1 |
| Water | rest | rest |

Figure 1:
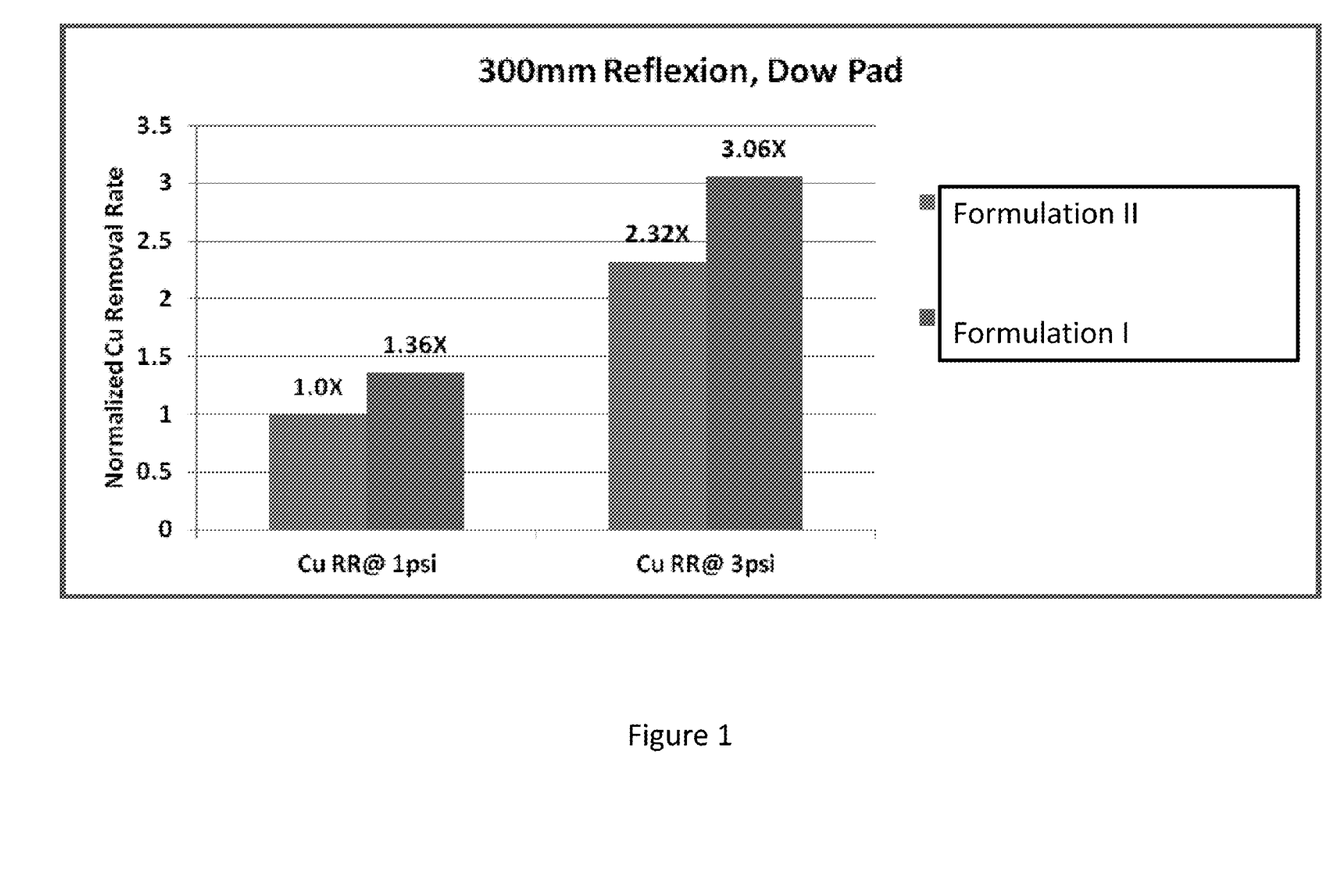
FIG. 1 depicts the copper polishing rates from Formulation I comprising two amino acids and Formulation II comprising only one amino acid.

More specifically, the copper polishing rates were shown in FIG. 1. The dishing performance was shown in FIG. 2.

Figure 2:
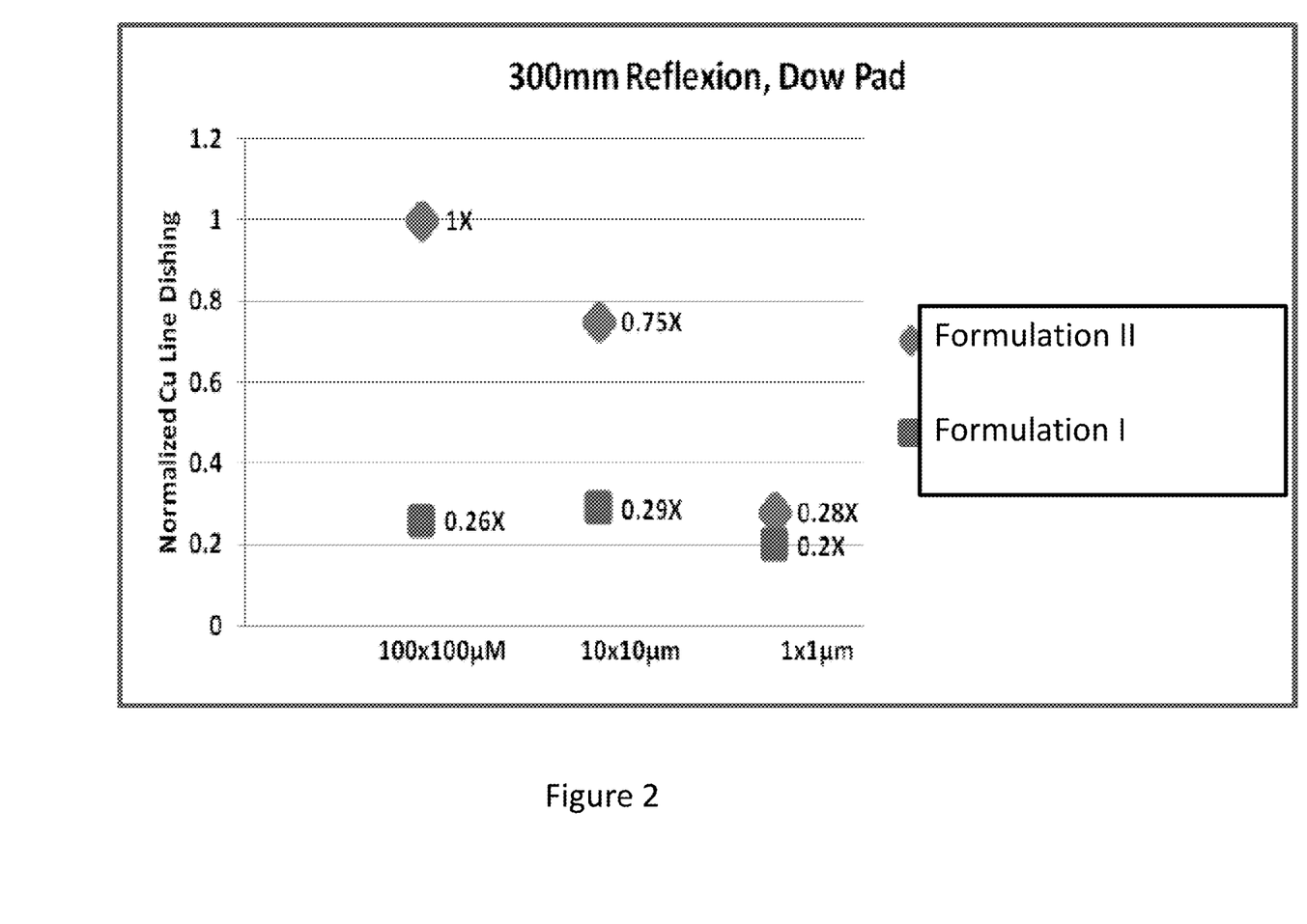
FIG. 2 depicts the dishing performance from Formulation I comprising two amino acids and Formulation II comprising only one amino acid.

As evident from FIGS. 1 and 2, a clear improvement in performance with regards to removal rate (increased) and dishing across various line widths (dramatically reduced) was obtained while using slurries with two amino acids.

The formulation engineering and optimization in the present invention provided significant improvements in dishing performance. The improvements across a wide range of copper line-widths to the point that dishing showed an insensitivity to feature size.

The embodiments of this invention listed above, including the working example, are exemplary of numerous embodiments that may be made of this invention. It is contemplated that numerous other configurations of the process may be used, and the materials used in the process may be elected from numerous materials other than those specifically disclosed.

The invention claimed is:

1. A copper chemical mechanical polishing (CMP) formulation consisting essentially of:
   0.001 to 0.25 wt % particulate materials;
   0.01 to 16 wt % at least two amino acids selected from the group consisting of aminoacetic acid (glycine), serine, lysine, glutamine, L-alanine, DL-alanine, Beta-alanine, iminoacetic acid, asparagine, aspartic acid, valine, sarcosine, bicine, tricin, proline, and mixtures thereof;
   0.25 to 5 wt % oxidizer;
   0.1 ppm to 2 wt % corrosion inhibitor;
   water;
   and optionally at least one selected from the group consisting of
   a surfactant selected from the group consisting of phenyl ethoxylate surfactant, acetylenic diol surfactant, sulfate or sulfonate surfactant, glyceroal propoxylate, glyceroal ethoxylate, non-ionic alkyl ethoxylate surfactant, amine oxide surfactant, glycolic acid ethoxylate oleyl ether, ethoxylated alcohols, and combinations thereof;
   pH adjusting agent; and
   biocide;
   wherein
   the particulate material is selected from the group consisting of fumed silica, colloidal silica, fumed alumina, colloidal alumina, cerium oxide, titanium dioxide, zirconium oxide, polystyrene, polymethyl methacrylate, mica, hydrated aluminum silicate, and mixtures thereof; and
   weight concentration ratio of one amino acid to another amino acid used in the slurry ranges from 25:75 to 75:25; and
   the formulation has a pH from 4 to 9.

2. The chemical mechanical polishing (CMP) formulation of claim 1, wherein the oxidizer is selected from the group consisting of hydrogen peroxide, ammonium dichromate, ammonium perchlorate, ammonium persulfate, benzoyl peroxide, bromates, calcium hypochlorite, eerie sulfate, chlorates, chromium trioxide, ferric trioxide, ferric chloride, iodates, iodine, magnesium perchlorate, magnesium dioxide, nitrates, periodic acid, permanganic acid, potassium dichromate, potassium ferricyanide, potassium permanganate, potassium persulfate, sodium bismuthate, sodium chlorite, sodium dichromate, sodium nitrite, sodium perborate, sulfates, peracetic acid, urea-hydrogen peroxide, perchloric acid, di-t-butyl peroxide, monopersulfates, dipersulfates, and combinations thereof.

3. The chemical mechanical polishing (CMP) formulation of claim 1, wherein the corrosion inhibitor is selected from the group consisting of nitrogenous cyclic compound selected from the group consisting of 1,2,3-triazole, 1,2,4 triazole, 1,2,3-benzotriazole, 5-methylbenzotriazole, benzotriazole, 1-hydroxybenzotriazole, 4-hydroxybenzotriazole, 4-amino-4H-1,2,4-triazole, benzimidazole; 5-amino triazole, benzothiazole, triazinethiol, triazinedithiol, and triazinetrithiol; isocyanurate and combinations thereof.

4. The chemical mechanical polishing (CMP) formulation of claim 1, wherein the particulate material is colloidal silica; the amino acid is selected from the group consisting of aminoacetic acid (glycine), alanine, bicine, and sarcosine; the oxidizer is hydrogen peroxide; the corrosion inhibitor is selected from the group consisting of 1,2,4-triazole and 5-amino triazole; the surfactant is selected from the group consisting of phenyl ethoxylate surfactant, acetylenic diol surfactant, ethoxylate-propoxylate surfactant, polyether dispersion; the water is deionized water; and the pH is from 6 to 8.

5. A method of chemical mechanical polishing a copper containing semiconductor substrate, comprising steps of:
   Providing the semiconductor substrate having a surface containing copper;
   providing a polishing pad;
   providing a chemical mechanical polishing (CMP) formulation consisting essentially of
      0.001 to 0.25 wt % particulate materials;
      0.01 to 16 wt % at least two amino acids selected from the group consisting of aminoacetic acid (glycine), serine, lysine, glutamine, L-alanine, DL-alanine, Beta-alanine, iminoacetic acid, asparagine, aspartic acid, valine, sarcosine, bicine, tricin, proline, and mixtures thereof;
      0.25 to 5 wt % oxidizer,
      0.1 ppm to 2 wt % corrosion inhibitor,
      water;
      and optionally at least one selected from the group consisting of
      a surfactant selected from the group consisting of phenyl ethoxylate surfactant, acetylenic diol surfactant, sulfate or sulfonate surfactant, glyceroal propoxylate, glyceroal ethoxylate, non-ionic alkyl ethoxylate surfactant, amine oxide surfactant, glycolic acid ethoxylate oleyl ether, ethoxylated alcohols, and combinations thereof;
      pH adjusting agent; and
      biocide;
      wherein
         the particulate material is selected from the group consisting of fumed silica, colloidal silica, fumed alumina, colloidal alumina, cerium oxide, titanium dioxide, zirconium oxide, polystyrene, polymethyl methacrylate, mica, hydrated aluminum silicate, and mixtures thereof;
         weight concentration ratio of one amino acid to another amino acid used in the slurry ranges from 25:75 to 75:25; and
         the formulation has a pH from 4 to 9;
   contacting the surface of the semiconductor substrate with the polishing pad and the chemical mechanical polishing formulation; and
   polishing the surface of the semiconductor;
   wherein at least a portion of the surface containing copper is in contact with both the polishing pad and the chemical mechanical polishing formulation.

6. The method of claim 5, wherein the oxidizer is selected from the group consisting of hydrogen peroxide, ammonium dichromate, ammonium perchlorate, ammonium persulfate, benzoyl peroxide, bromates, calcium hypochlorite, ceric sulfate, chlorates, chromium trioxide, ferric trioxide, ferric chloride, iodates, iodine, magnesium perchlorate, magnesium dioxide, nitrates, periodic acid, permanganic acid, potassium dichromate, potassium ferricyanide, potassium permanganate, potassium persulfate, sodium bismuthate, sodium chlorite, sodium dichromate, sodium nitrite, sodium perborate, sulfates, peracetic acid, urea-hydrogen peroxide, perchloric acid, di-t-butyl peroxide, monopersulfates, dipersulfates, and combinations thereof.

7. The method of claim 5, wherein the corrosion inhibitor is selected from the group consisting of nitrogenous cyclic compound selected from the group consisting of 1,2,3-triazole, 1,2,4 triazole, 1,2,3-benzotriazole, 5-methylbenzotriazole, benzotriazole, 1-hydroxybenzotriazole, 4-hydroxy-benzotriazole, 4-amino-4H-1,2,4-triazole, benzimidazole; benzothiazole, 5-amino triazole, triazinethiol, triazinedithiol, and triazinetrithiol; isocyanurate and combinations thereof.

8. The method of claim 5, wherein the particulate material is colloidal silica; the amino acid is selected from the group consisting of aminoacetic acid (glycine), alanine, bicine, and sarcosine; the oxidizer is hydrogen peroxide; the corrosion inhibitor is selected from the group consisting of 1,2,4-triazole and 5-amino triazole; the surfactant is selected from the group consisting of phenyl ethoxylate surfactant, acetylenic diol surfactant, ethoxylate-propoxylate surfactant, polyether dispersion; the water is deionized water; and the pH is from 6 to 8.

9. A system of chemical mechanical polishing, comprising
   a semiconductor substrate having a surface containing copper;
   providing a polishing pad;
   providing a chemical mechanical polishing (CMP) formulation consisting essentially of
      0.001 to 0.25 wt % particulate materials;
      0.01 to 16 wt % at least two amino acids selected from the group consisting of aminoacetic acid (glycine), serine, lysine, glutamine, L-alanine, DL-alanine, Beta-alanine, iminoacetic acid, asparagine, aspartic acid, valine, sarcosine, bicine, tricin, proline, and mixtures thereof;
      0.25 to 5 wt % oxidizer;
      0.1 ppm to 2 wt % corrosion inhibitor;
      water;
      and optionally at least one selected from the group consisting of
      a surfactant selected from the group consisting of phenyl ethoxylate surfactant, acetylenic diol surfactant, sulfate or sulfonate surfactant, glyceroal propoxylate, glyceroal ethoxylate, non-ionic alkyl ethoxylate surfactant, amine oxide surfactant, glycolic acid ethoxylate oleyl ether, ethoxylated alcohols, and combinations thereof;
      pH adjusting agent; and
      biocide;
      wherein
         the particulate material is selected from the group consisting of fumed silica, colloidal silica, fumed alumina, colloidal alumina, cerium oxide, titanium dioxide, zirconium oxide, polystyrene, polymethyl methacrylate, mica, hydrated aluminum silicate, and mixtures thereof;
         weight concentration ratio of one amino acid to another amino acid used in the slurry ranges from 25:75 to 75:25; and
         the formulation has a pH from 4 to 9;
   wherein at least a portion of the surface containing copper is in contact with both the polishing pad and the chemical mechanical polishing formulation.

10. The system of claim 9, wherein the oxidizer is selected from the group consisting of hydrogen peroxide, ammonium dichromate, ammonium perchlorate, ammonium persulfate, benzoyl peroxide, bromates, calcium hypochlorite, ceric sulfate, chlorates, chromium trioxide, ferric trioxide, ferric chloride, iodates, iodine, magnesium perchlorate, magnesium dioxide, nitrates, periodic acid, permanganic acid, potassium dichromate, potassium ferricyanide, potassium permanganate, potassium persulfate, sodium bismuthate, sodium chlorite, sodium dichromate, sodium nitrite, sodium perborate, sulfates, peracetic acid, urea-hydrogen peroxide, perchloric acid, di-t-butyl peroxide, monopersulfates, dipersulfates, and combinations thereof.

11. The system of claim 9, wherein the corrosion inhibitor is selected from the group consisting of nitrogenous cyclic compound selected from the group consisting of 1,2,3-triazole, 1,2,4-triazole, 1,2,3-benzotriazole, 5-methylbenzotriazole, benzotriazole, 1-hydroxybenzotriazole, 4-hydroxybenzotriazole, 4-amino-4H-1,2,4-triazole, 5-amino triazole; benzimidazole; benzothiazole, triazinethiol, triazinedithiol, and triazinetrithiol; isocyanurate and combinations thereof.

12. The system of claim 9, wherein the particulate material is colloidal silica; the amino acid is selected from the group consisting of aminoacetic acid (glycine), alanine, bicine, and sarcosine; the oxidizer is hydrogen peroxide; the corrosion inhibitor is selected from the group consisting of 1,2,4-triazole and 5-amino triazole; the surfactant is selected from the group consisting of phenyl ethoxylate surfactant, acetylenic diol surfactant, ethoxylate-propoxylate surfactant, polyether dispersion; the water is deionized water; and the pH is from 6 to 8.

\* \* \* \* \*